United States Patent [19]

Wagner

[11] Patent Number: 4,507,795
[45] Date of Patent: Mar. 26, 1985

[54] APPARATUS AND METHOD FOR LOCATING LEADING AND TRAILING EDGES OF RF PULSES

[75] Inventor: Carl M. Wagner, Mesa, Ariz.

[73] Assignee: Motorola, Inc., Schaumburg, Ill.

[21] Appl. No.: 465,981

[22] Filed: Feb. 14, 1983

[51] Int. Cl.³ .................. H03K 5/153; H03K 5/20
[52] U.S. Cl. .................. 375/95; 307/358; 328/147; 328/149
[58] Field of Search .................. 375/95, 99, 102, 104; 455/303, 304, 305, 309; 307/510, 518, 528; 328/108, 109, 135, 147, 149, 150

[56] References Cited

U.S. PATENT DOCUMENTS

| 3,459,964 | 8/1969 | Yoshida et al. | 307/236 |
| 3,617,900 | 11/1971 | Fink | 375/102 |
| 3,763,436 | 10/1973 | Haw | 307/358 |
| 4,067,013 | 1/1978 | Smith | 455/303 |
| 4,179,664 | 12/1979 | Bedwell | 307/358 |
| 4,358,738 | 11/1982 | Kahn | 307/358 |

Primary Examiner—Benedict V. Safourek
Attorney, Agent, or Firm—Jonathan P. Meyer

[57] ABSTRACT

An apparatus and method for accurately locating the edges of RF pulses is suitable for use in position determining receivers and the like. Matched detector channels, one of which is attenuated for use as a threshold, are compared after one has been delayed to produce a comparator transition coincident with either the leading, the trailing, or both edges of the input RF pulses.

7 Claims, 5 Drawing Figures

| INPUT LEVEL (dBm) | $T_R$ (10-90%) | | |
|---|---|---|---|
| | 10ns | 50ns | 100ns |
| 0 | 0 | 0 | −1 |
| −2 | −1 | −2 | −2 |
| −4 | −1 | −1 | −2 |
| −6 | −2 | −2 | −2 |
| −8 | −2 | −1 | −3 |
| −10 | −1 | −1 | −2 |
| −12 | −1 | −1 | −3 |
| −14 | −1 | −1 | −2 |
| −16 | −1 | −1 | −2 |
| −18 | −1 | −1 | −2 |
| −20 | −1 | −1 | −3 |
| −22 | −1 | 0 | −2 |
| −24 | 0 | 0 | −2 |
| −26 | +1 | +1 | 0 |
| −28 | +1 | +3 | 0 |
| −30 | +3 | +3 | +2 |

*FIG. 3*

APPARATUS AND METHOD FOR LOCATING LEADING AND TRAILING EDGES OF RF PULSES

FIELD OF THE INVENTION

The present invention relates, in general, to circuits for locating the leading and trailing edges of radio frequency pulses. More particularly, the invention relates to an apparatus and method for accurately locating the leading and trailing edges of pulses of RF enery by utilizing matched detector channels.

BACKGROUND OF THE INVENTION

Highly accurate location of the leading and trailing edges of pulsed RF signals in required in many applications. For instance, in position determining receivers, the accuracy of the position determination depends on the precise measurement of the time of arrival of pulsed RF signals. Prior art techniques have relied on logging element, typically a log amplifier, to linearize the output of a square law detector so that a delayed channel can be compared to an attenuated channel to accurately locate the leading edge of an RF pulse. The accuracy with which the output of the detector is linearized severely limits the accuracy of the apparatus and demands careful custom matching of the detector and amplifier. Combined with requirements of increased dynamic range, larger ranges of rise time and pulse duration and reduced power consumption and size, these considerations have rendered techniques inadequate.

SUMMARY OF THE INVENTION

Accordingly, it is an object of the present invention to provide an improved apparatus and method for locating the leading and trailing edges of RF pulses.

It is a further object of the present invention to provide an apparatus and method for the location of the leading and trailing edges of pulsed RF signals which does not rely on the linearization of a square law detector.

A particular embodiment of the present invention comprises a leading edge location apparatus in which a received RF signal is divided between a main channel and a threshold channel. The signal in the threshold channel is 3 dB below the signal in the main channel. Each channel comprises a detector, a low pass filter and an amplifier. The elements of each channel are carefully matched to the corresponding elements of the other channel. A delay line is inserted in the main channel between the filter and amplifier. The outputs of the channels are compared by a comparator which produces a positive going transition when the power level of an RF pulse in the main channel reaches one-half of its final value.

The accuracy of the apparatus depends on the ability to match the elements of the two channels, particularly the detectors and amplifiers. Since these are primarily transistor and diode devices which may be fabricated on the same integrated circuit or otherwise accurately matched, the accuracy of the present invention is much better than that of prior devices.

Alternate embodiments of the present invention include a trailing edge location apparatus and an apparatus for indicating both the leading and trailing edges of RF pulses.

These and other objects and advantages of the present invention will be apparent to one skilled in the art from the detailed description below taken together with the drawings.

BRIEF DECRIPTION OF THE DRAWINGS

FIG. 3 is a table showing the accuracy of an apparatus according to the principles of the present invention over a range of rise times and input signal levels;

DETAILED DESCRIPTION OF THE INVENTION

Figure 1:
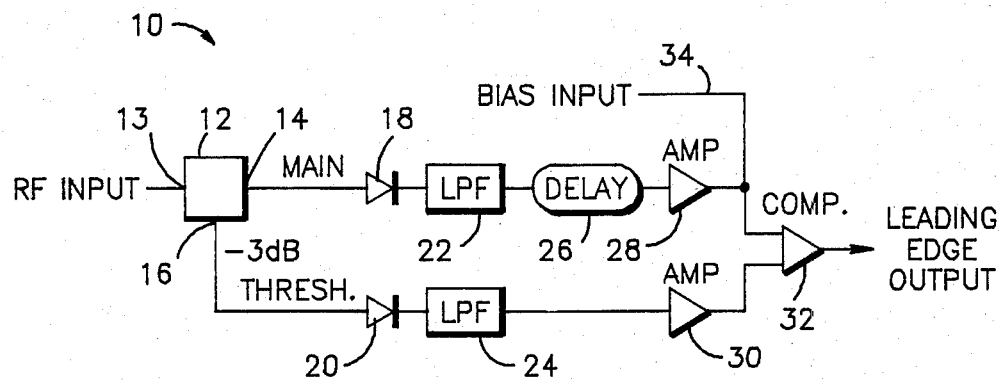
FIG. 1 is a block diagram of a leading edge location apparatus according to the principles of the present invention.

FIG. 1 is a block diagram of an apparatus 10 for locating the leading edges of RF pulses. A power divider 12 has an RF input 13, a main output 14 and a threshold output 16. The signal level at main output 14 is approximately 3 dB above the signal level at threshold output 16. Power divider 12 is typically a standard 3 dB coupler but it may also be a simple power splitter combined with a 3 dB attenuator in the threshold channel. The 3 dB difference between main output 14 and threshold output 16 is provided so that apparatus 10 will be triggered when the signal in the main channel has reached one-half of its eventual power level, as will be understood more clearly below. However, this triggering level may be chosen otherwise if desired. Once the signal level difference established by power divider 12 is established, it is carefully maintained by matching each of the elements in the main channel with its counterpart in the threshold channel.

A first detector 18 and a second detector 20 are coupled into the main and threshold channels respectively following power divider 12. Detectors 18 and 20 function to detect the envelope of the RF pulses received by apparatus 10. Detectors 18 and 20 are preferably diode detectors which have either been cut from the same wafer or are part of the same integrated circuit so that the responses of the two detectors are as closely matched as possible. Commercial matched diode pairs with errors as low as ±0.25 dB are readily available.

Next, a first low pass filter 22 and a second low pass filter 24 are coupled into the main and threshold channels respectively. Low pass filters 22 and 24 serve to improve the signal to noise ratio in the two channels. The only requirement of filters 22 and 24 is that they are substantially identical. In some cases, the requirement for filters 22 and 24 may be avoided if the passbands of the subsequent amplifiers are properly chosen. Following low pass filter 22 in the main channel is a delay line 26. As is further discussed below, the amount of delay applied by delay line 26 is approximately equal to the maximum expected rise time of the RF pulses.

Next, a first amplifier 28 and a second amplifier 30 are coupled to the main and threshold channels, respectively. The function of amplifiers 28 and 30 is to increase the signal levels produced by detectors 18 and 20 to levels more suitable for further use. Again, the only requirement is that amplifiers 28 and 30 be substantially identical. The preferred way of achieving very close matching between amplifier 28 and amplifier 30 is to fabricate both as part of the same integrated circuit. This provides both for careful matching of the characteristics of the two devices and for nearly identical environments. It is also possible to closely match the gains of amplifiers 28 and 30 by means of well-known feedback techniques. A comparator 32 is coupled to the main and threshold channels at the outputs of amplifier 28 and amplifier 30, respectively and produces a positive going transition when a signal level at the leading edge of a pulse in the main channel reaches one-half of its final power.

Finally, a bias input 34 is coupled to the output of amplifier 28 so that the triggering level of the apparatus may be altered. In other words, if it is desirable for apparatus 10 to trigger at some point other than half-power (−3 dB), a suitable DC bias voltage is applied to the main channel at bias input 34 to raise or lower the signal level in the main channel with respect to the threshold channel. As will be more readily apparent from the description of FIG. 4 below, apparatus 10 may be converted to a trailing edge location apparatus merely by placing delay 26 in the threshold channel as opposed to the main channel.

Figure 2:
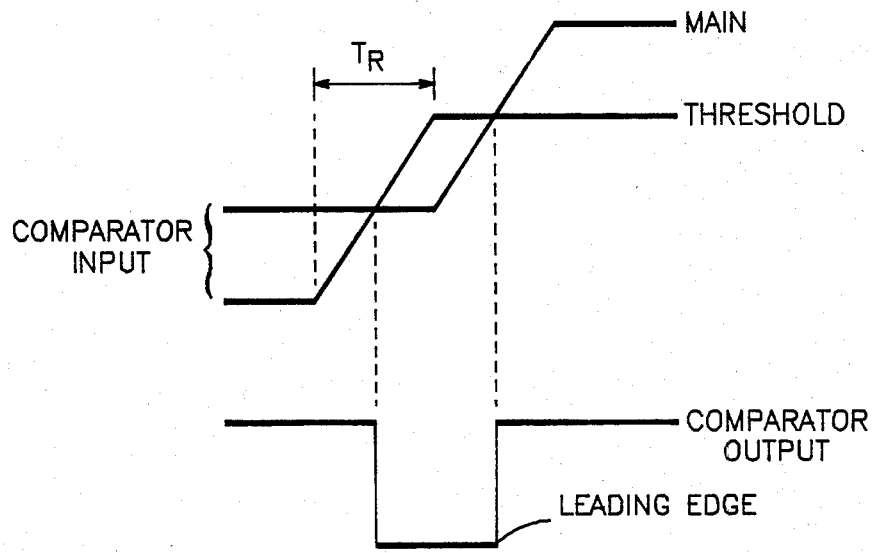
FIG. 2 is a timing diagram illustrating the operation of the apparatus of FIG. 1.

Referring now to FIG. 2, the operation of the apparatus of FIG. 1 is described with reference to a timing diagram. The signals identified as the main and threshold signals in FIG. 2 correspond to the signals present at the outputs of amplifiers 28 and 30, respectively. Initially, when no RF pulse is present and only receiver noise is being detected, the signal level in the main channel is 3 dB above the signal level in the threshold channel and the comparator output is high. Next, when an RF pulse enters apparatus 10 the signal level in the threshold channel rises, eventually crossing the signal level in the main channel and reaching a maximum value. When the signal level in the threshold channel crosses the signal level in the main channel the comparator output transitions to a low state. At this point, the signal level in the main channel has not yet been effected by the pulse because of delay 26. Since the signal level in the threshold channel must have reached its maximum value before the pulse in the main channel reaches amplifier 28 in order to provide an accurate threshold, the amount of delay supplied by delay 26 is chosen to be approximately equal to the maximum rise time $T_R$ of the anticipated RF pulses. After the delay time has passed the signal level in the main channel commences to rise and eventually crosses the signal level in the threshold channel at the half power point. This causes the comparator output to transition back to the high state. This transition is defined as precisely locating the leading edge of the RF pulse in the main channel.

It should be noted that the minimum pulse width of the anticipated RF pulses must be greater than the maximum rise time $T_R$. It is also possible to use negative detectors in place of positive detectors, in which case the leading edge of the RF pulse will be represented by negative going transitions in the signal levels of the main and threshold channels, but the operation of the apparatus will be otherwise unaltered. In addition, it should be noted that the pulse repetition period of the RF pulses must be greater than the selected delay time.

Referring now to FIG. 3 the accuracy of a particular circuit constructed according to the principles of FIG. 1 is described. The circuit was constructed using a pair of matched Schottky diodes with an error of approximately ±0.25 dB and amplifiers with bandwidths of approximately 6 MHz. It was found that low pass filters were not necessary for this particular circuit. A standard 100 ns delay line was used. A comparator with an error of approximately ±2 ns was used. In other words, the response time of comparator 32 is uncertain by ±2 ns. The data of FIG. 3 indicate that for rise times, defined as the time between the 10% and 90% power points, of 10 ns, 50 ns and 100 ns and over an input dynamic range of 30 dB, the peak error of the apparatus was approximately 6 ns. This corresponds to a positioning accuracy of approximately 2 meters at the speed of light. Typical prior art techniques provide accuracies of approximately 20 ns over a 15 dB to 18 dB dynamic range.

Figure 4:
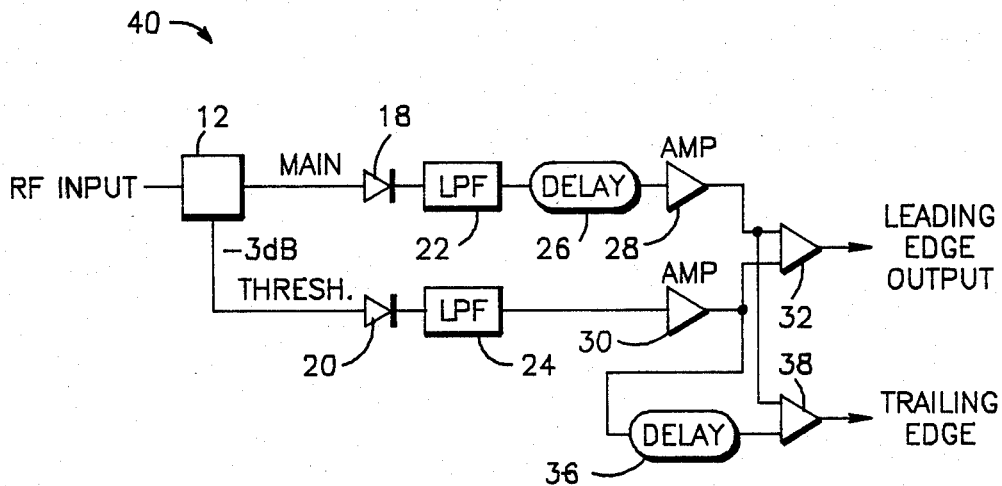
FIG. 4 is a block diagram of a leading and trailing edge location apparatus according to the principles of the present invention.

Referring now to FIG. 4, a leading and trailing edge location apparatus according to the principles of the present invention and suitable for use in pulse width determination is described. Apparatus 40 includes a basic leading edge location apparatus as was described with reference to FIG. 1 comprising a power divider 12 having main and threshold outputs, a matched detector pair 18 and 20, a matched filter pair 22 and 24, a delay circuit 26, a matched amplifier pair 28 and 30 and a comparator 32. As described above, a positive going transition of the output of comparator 32 locates the leading edge of an RF pulse in the main channel. In addition, a second comparator 38 has an input coupled to the output of amplifier 28 and an input coupled through a delay circuit 36 to the output of amplifier 30. Delay circuit 36 applies a delay approximately equal to twice the delay applied by delay circuit 26. Therefore, the output of comparator 38 locates the trailing edge of an RF pulse in the main channel. As is apparent, the outputs of comparators of 32 and 38 may be coupled to the enable and disable inputs, respectively, of a counter so that a measure of the pulse width may be obtained.

Figure 5:
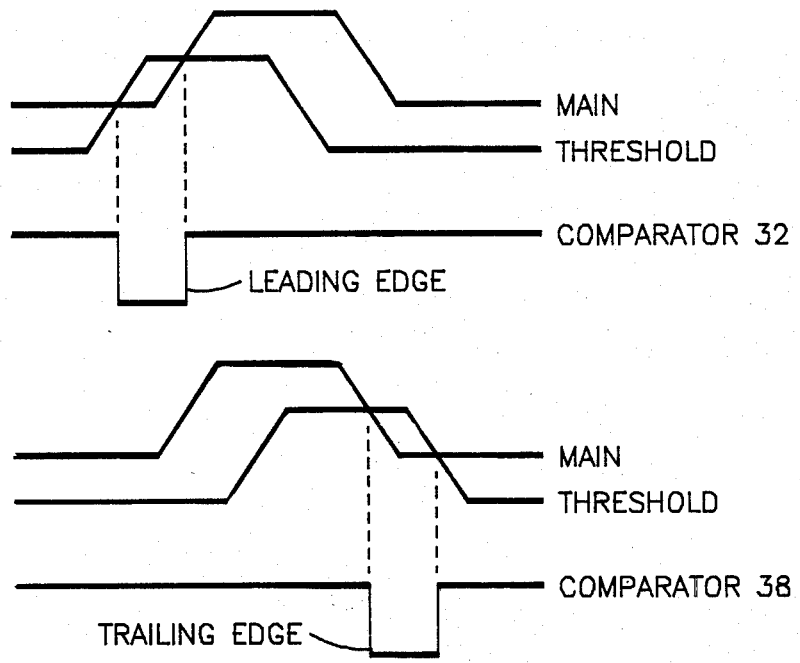
FIG. 5 is a timing diagram corresponding to the apparatus of FIG. 4.

Referring now to FIG. 5, the operation of the apparatus of FIG. 4 is described with reference to a timing diagram. The operation of the leading edge location apparatus is precisely as described above. The main and threshold channel signals indicated are to be found at the inputs of comparators 32 and 38. Comparator 32 transitions from a high state to a low state when the signal level in the threshold channel rises above the signal level in the main channel and transitions from a low state to a high state, indicating the leading edge of the pulse, when the signal level in the main channel crosses the signal level in the threshold channel. In essence, the operation of the trailing edge apparatus is identical. Comparator 38 compares the same main channel signal as is seen by comparator 32 to a doubly delayed threshold channel signal. Therefore, comparator 34 transitions from a high a state to a low state when the trailing edge of the pulse in the main channel falls below the delayed threshold channel thus indicating the trailing edge of the pulse. In addition, comparator 34 transitions back to a high state when the delayed threshold channel signal crosses the main channel signal. It should be noted that while a positive going transition of comparator 32 locates the leading edge of the pulse it is a negative going transition of comparator 34 which locates the trailing edge of the pulse. The error in the pulse width determination supplied by the apparatus of FIG. 4 is approximately twice the error of the leading edge location apparatus of FIG. 1.

While the present invention has been particularly shown and described with reference to preferred embodiment thereof, it will be understood by those skilled in the art that various other modifications and changes may be made to the present invention from the principles of the invention described above without departing from the spirit and scope thereof.

I claim:

1. An apparatus for locating edges of RF pulses comprising:
    means for dividing an RF input signal unequally between a main channel and a threshold channel;
    main channel and threshold channel detectors coupled into said main and threshold channels, respectively, said main channel and threshold channel detectors being substantially identical;
    main channel and threshold channel amplifiers coupled to said main channel and threshold channel detectors respectively, said main and threshold channel amplifiers being substantially identical;
    at least one comparator coupled to said main and threshold channel amplifiers, said comparator producing a transition coincident with an edge of an RF pulse when a signal level in said main channel crosses a signal level in said threshold channel; and
    at least one delay means coupled to one of said main channel and said threshold channel ahead of said at least one comparator.

2. An apparatus according to claim 1 wherein said at least one delay means comprises:
    a delay circuit coupled to said main channel applying a delay time approximately equal to a maximum rise time of said RF pulses, whereby said comparator produces a transition coincident with a leading edge of said each of RF pulses.

3. An apparatus according to claim 1 wherein said at least one delay means comprises:
    a delay circuit coupled to said threshold channel applying a delay time approximately equal to a maximum rise time of said RF pulses, whereby said comparator produces a transition coincident with a trailing edge of said each of RF pulses.

4. An apparatus according to claim 1 wherein said at least one delay means comprises:
    a first delay circuit coupled to said main channel ahead of a first comparator, said first delay circuit applying a delay time approximately equal to a maximum rise time of said RF pulses; and
    a second delay circuit coupled to said threshold channel ahead of a second comparator, said second delay circuit applying a delay time approximately equal to twice the delay time of said first delay circuit, whereby said first comparator produces a transition coincident with a leading edge of said RF pulses and said second comparator produces a transition coincident with a trailing edge of said RF pulses.

5. A method of locating edges of RF pulses comprising the steps of:
    dividing said RF pulses unequally between a main channel and a threshold channel;
    applying substantially identical detecting, filtering and amplifying functions to said main and threshold channels;
    applying a delay function to a least one of said main and threshold channels; and
    comparing outputs of said main and threshold channel signals and producing a transition when a signal level in said main channel crosses a signal level in said threshold channel.

6. A method according to claim 5 wherein said step of applying a delay function comprises the step of:
    applying a delay approximately equal to a maximum rise time of said RF pulses to said main channel.

7. A method according to claim 5 wherein said step of applying a delay function comprises the step of:
    applying a delay approximately equal to a maximum rise time of said RF pulses to said threshold channel.

* * * * *